(12) United States Patent
Bradley

(10) Patent No.: US 12,276,688 B2
(45) Date of Patent: Apr. 15, 2025

(54) ELECTROMAGNETIC FIELD MONITORING DEVICE

(71) Applicant: Arthur Thomas Bradley, Yorktown, VA (US)

(72) Inventor: Arthur Thomas Bradley, Yorktown, VA (US)

(73) Assignee: Faraday Defense Corporation, Kalamazoo, MI (US)

( * ) Notice: Subject to any disclaimer, the term of this patent is extended or adjusted under 35 U.S.C. 154(b) by 236 days.

(21) Appl. No.: 17/871,913

(22) Filed: Jul. 23, 2022

(65) Prior Publication Data

US 2023/0236232 A1 Jul. 27, 2023

Related U.S. Application Data

(60) Provisional application No. 63/302,730, filed on Jan. 25, 2022.

(51) Int. Cl.
  *G01R 19/22* (2006.01)
  *G01R 29/08* (2006.01)
  *H01Q 5/35* (2015.01)

(52) U.S. Cl.
  CPC .......... *G01R 29/0878* (2013.01); *H01Q 5/35* (2015.01)

(58) Field of Classification Search
  CPC ............ G01R 29/0814; G01R 29/0857; G01R 29/0871; G01R 29/0878
  See application file for complete search history.

(56) References Cited

U.S. PATENT DOCUMENTS

| | | | |
|---|---|---|---|
| 2002/0075189 A1* | 6/2002 | Carillo, Jr. ............. | H01Q 9/285 343/702 |
| 2007/0107766 A1* | 5/2007 | Langley, II ............. | H02S 99/00 290/1 R |
| 2013/0281036 A1* | 10/2013 | Kolokotronis ........... | H01Q 1/24 343/700 R |
| 2016/0124041 A1* | 5/2016 | Pathak .................. | H01L 23/576 324/629 |
| 2019/0011487 A1* | 1/2019 | Bassen ............... | G01R 29/0871 |
| 2019/0107566 A1* | 4/2019 | Lachica ............. | G01R 29/0892 |
| 2021/0201757 A1* | 7/2021 | Kim ..................... | G09G 3/3225 |

* cited by examiner

*Primary Examiner* — Thang X Le
(74) *Attorney, Agent, or Firm* — Patents and Licensing LLC; Daniel W Juffernbruch

(57) ABSTRACT

The present invention is directed at an electromagnetic field monitoring device configured to continuously monitor properties of an electromagnetic field. The device may be solely powered by the ambient electromagnetic energy of an electromagnetic field, removing any reliance on external power sources or batteries. Monitored properties may include real-time electromagnetic field strength, peak electromagnetic field strength in a time period, electromagnetic field exceedance, and cumulative electromagnetic field dose. The device detects otherwise concealed sources of electromagnetic fields, such as hidden cameras or microphones. The device may be integrated into a variety of products, including, but not limited to, a keychain attachment, lanyard attachment, eyeglasses frame, handheld instrument, identification card, writing instrument, business card, adhesive sticker, ring, or necklace pendant.

19 Claims, 22 Drawing Sheets

ELECTROMAGNETIC FIELD MONITORING DEVICE

CROSS-REFERENCE TO RELATED APPLICATIONS

This application claims the benefit of U.S. provisional patent application No. 63/302,730 filed on Jan. 25, 2022 and titled "Energy Harvesting Device to Warn of Elevated Electromagnetic Fields," the content of which is incorporated by reference in its entirety.

BACKGROUND

Field of the Invention

The present invention relates generally to devices powered by otherwise wasted energy converted into usable energy, and, in particular, to an electromagnetic field monitoring device powered solely by the ambient electromagnetic energy of an electromagnetic field.

Scope of the Prior Art

Common sources of electromagnetic fields (EMFs) include devices that use Wireless Fidelity (WiFi), Bluetooth, ultrawideband, and cellular communications. Additional sources of EMFs include power distribution equipment, electrical test equipment, solar and interstellar disturbances, and radar systems.

While gaps remain in our scientific understanding of potential hazards, some studies have concluded that workers exposed to high electromagnetic fields experience increased cancer rates. Further, many people share a concern that long-term exposure to high levels of EMFs may cause myriad of other illnesses, including, but not limited to, headaches, elevated heart rate, and insomnia. Further, individuals with pacemakers or those who suffer from hyper-EMF sensitivity may face additional risks from elevated EMF levels. To address these concerns, numerous guides place limits on the recommended maximum EMF exposure, such as those from the International Commission on Non-Ionizing Radiation Protection (ICNIRP) and the Institute of Electrical and Electronics Engineers (IEEE).

To monitor potentially harmful EMFs, existing EMF monitoring devices monitor the ambient electromagnetic energy of an electromagnetic field environment and display the strength of the electric and magnetic fields. Some devices measure low-frequency emissions, such as those associated with electrical power distribution, while others measure radio frequency (RF) emissions, such as those used in wireless communications. Such devices generally measure electromagnetic field levels to determine if they pose a risk to human health or have the potential to disturb sensitive electronic equipment. Additionally, they may be used to warn of hidden wireless monitoring devices, such as cameras, and microphones. Devices rely on either internal batteries or external receptacle power for their operation. As such, portable units must generally be cycled off when not in use to extend the lifetime of their batteries. Even the most modern state-of-the-art EMF monitoring devices are not energy efficient enough to be powered solely by using energy harvesting techniques.

Likewise, existing electromagnetic energy harvesting devices are used almost exclusively for the purpose of establishing broad "Internet of Things" (IoT) networks in which wasted energy is used to power intercommunication between sensors, thermostats, controllers, watches, RFID tags, and other low-power devices. To our knowledge, energy harvesting techniques have not been used to continuously monitor properties of an electromagnetic field, such as real-time electromagnetic field strength, peak electromagnetic field strength in a time period, electromagnetic field exceedance, and cumulative electromagnetic field dose.

Therefore, what is clearly needed is a device that monitors an electromagnetic field using received ambient electromagnetic energy as its sole power source. Such a device would allow continuous monitoring of the electromagnetic field environment without the need for batteries or access to uninterrupted electrical power, such as an AC receptacle. With the requirement for batteries or continuous electrical power removed, an electromagnetic field monitoring device could be greatly miniaturized, allowing for its integration into a host of products that are not otherwise compatible with existing electromagnetic field monitoring technologies.

SUMMARY

The present disclosure satisfies the foregoing needs by providing, inter alia, an electromagnetic field monitoring device for addressing each of the foregoing desirable traits.

The present invention is directed at an electromagnetic field monitoring device configured to receive ambient electromagnetic energy from an electromagnetic field and to indicate a property of the electromagnetic field. The device may be powered solely by the ambient electromagnetic energy received from the electromagnetic field. In some embodiments, the ambient electromagnetic energy may be received by an antenna. In some embodiments, properties of the electromagnetic field may be indicated by an indicator. Indicators may include visible indicators, audible indicators, and tactile indicators. Properties may include real-time electromagnetic field strength, peak electromagnetic field strength in a time period, electromagnetic field exceedance, and cumulative electromagnetic field dose.

According to an embodiment, the device may be comprised of an antenna configured to receive ambient electromagnetic field energy, an impedance matching network coupled to the antenna, a rectifier coupled to the impedance matching network and configured to output an analog voltage based on the ambient electromagnetic energy received by the antenna, and an indicator coupled to the rectifier and configured to indicate a property of an electromagnetic field.

According to another embodiment, the device may be comprised of a plurality of channels, each of the channels comprised of an antenna configured to receive ambient electromagnetic field energy, an impedance matching network coupled to the antenna, a rectifier coupled to the impedance matching network and configured to output an analog voltage based on the ambient electromagnetic energy received by the antenna, and an indicator coupled to the rectifier and configured to indicate a property of an electromagnetic field. In some embodiments, at least one of the indicators is further coupled to all of the rectifiers. In some embodiments, each of the antennas is configured to receive a same frequency or frequency range of the ambient electromagnetic energy. In some embodiments, at least one of the antennas is configured to receive a different frequency or frequency range of the ambient electromagnetic energy.

According to yet another embodiment, the device may be comprised of a first plurality of antennas configured to receive the ambient electromagnetic energy of the electromagnetic field, a second plurality of impedance matching networks, each of the impedance matching networks coupled to at least one of the antennas, a third plurality of rectifiers, each of the rectifiers coupled to at least one of the impedance matching networks and configured to output an analog voltage based on the ambient electromagnetic energy received by at least one of the antennas, and a fourth plurality of indicators, each of the indicators coupled to at least one of the rectifiers and configured to indicate the property of the electromagnetic field. In some embodiments, at least one of the indicators is further coupled to of all the rectifiers. In some embodiments, at least one of the antennas is configured to receive a different frequency or frequency range of the ambient electromagnetic energy. In some embodiments, at least one of the indicators is coupled differentially to at least two of the rectifiers.

The present invention can be used to continuously monitor properties of an electromagnetic field in nearly any environment without intervention by the operator or the need for battery or receptacle power. Indicators reflect numerous electromagnetic field properties, including, but not limited to, real-time electromagnetic field strength, peak electromagnetic field strength in a time period, electromagnetic field exceedance, and cumulative electromagnetic field dose.

Further, the present invention can also be used to detect and locate otherwise concealed radio frequency (RF) devices, such as hidden wireless cameras or microphones. Without user intervention, the present invention will provide autonomous indication of a nearby RF device, even when concealed. By moving the apparatus closer to the source, the real-time electromagnetic field level indicator will display a higher value, allowing the user to quickly locate the hidden device, or if failing to locate it, simply depart the area being monitored.

BRIEF DESCRIPTION OF THE DRAWINGS

The foregoing summary, as well as the following detailed description of preferred variations of the invention, will be better understood when read in conjunction with the appended drawings. For the purpose of illustrating the invention, there is shown in the drawings variations that are presently preferred. It should be understood, however, that the invention is not limited to the precise arrangements shown. In the drawings, where.

DETAILED DESCRIPTION

Implementations of the present technology will now be described in detail with reference to the drawings, which are provided as illustrative examples so as to enable those skilled in the art to practice the technology. Notably, the figures and examples below are not meant to limit the scope of the present disclosure to any single implementation or implementations. Wherever convenient, the same reference numbers will be used throughout the drawings to refer to same or like parts.

Moreover, while variations described herein are primarily discussed in the context harvesting ambient electromagnetic energy, it will be recognized by those of ordinary skill that the present disclosure is not so limited. In fact, the principles of the present disclosure described herein may be readily applied to energy harvesting in general, a term describing a process by which otherwise wasted energy, such as that from solar, thermal, wind, movement, or electromagnetic fields, is converted to usable energy.

In the present specification, an implementation showing a singular component should not be considered limiting; rather, the disclosure is intended to encompass other implementations including a plurality of the same component, and vice-versa, unless explicitly stated otherwise herein. Further, the present disclosure encompasses present and future known equivalents to the components referred to herein by way of illustration.

It will be recognized that while certain aspects of the technology are described in terms of a specific sequence of steps of a method, these descriptions are only illustrative of the broader methods of the disclosure and may be modified as required by the particular application. Certain steps may be rendered unnecessary or optional under certain circumstances. Additionally, certain steps or functionality may be added to the disclosed implementations, or the order of performance of two or more steps permuted. All such variations are considered to be encompassed within the disclosure disclosed and claimed herein.

Figure 1:
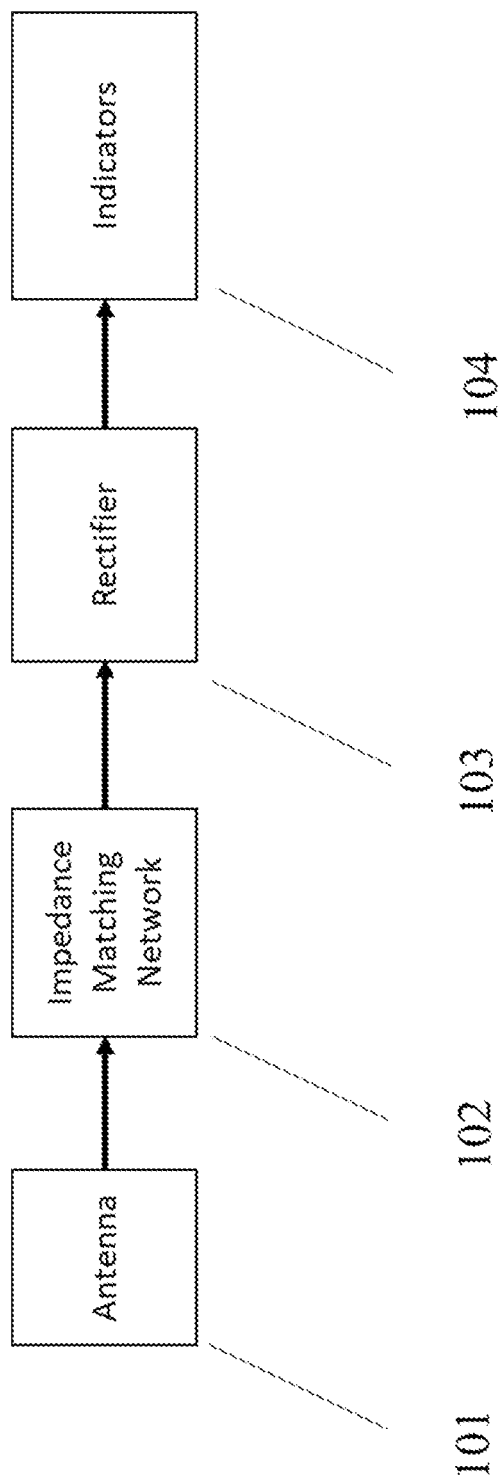
FIG. 1 is a block diagram illustrating example physical components of an electromagnetic field monitoring device, according to an embodiment.

FIG. 1 is a block diagram illustrating example physical components (e.g., hardware) of an electromagnetic field monitoring device, according to an embodiment. The electromagnetic field monitoring device may comprise an antenna 101, an impedance matching network 102, a rectifier 103, and one or more indicators 104.

The antenna 101 may be any standard device known in the art that is able to receive a time-varying electromagnetic signal (e.g., such as that of ambient electromagnetic energy) including, but not limited to, an antenna. According to an embodiment, the antenna 101 may be configured to receive one frequency, or a plurality of frequencies (e.g., a multi-band antenna), of ambient electromagnetic energy. Alternatively, the antenna 101 may be configured to receive one frequency range, or a plurality of frequency ranges (e.g., a multi-band antenna), of ambient electromagnetic energy. The antenna 101 may be manufactured into the circuit board assembly or be an on-board or off-board discrete component.

The impedance matching network 102 may be any standard network known in the art that is able to match the output impedance of the antenna 101 with the input impedance of the rectifier 103 to maximize the power transferred between said components. According to an embodiment, the impedance matching network 102 may be further configured to attenuate frequencies that are out of the desired detection band. Alternatively, the impedance matching network 102 may be used to set the efficiency of the device, making it more or less sensitive to electromagnetic fields.

The rectifier 103 may be any standard device known in the art that is able to convert a received time-varying electromagnetic signal (e.g., the ambient electromagnetic energy received by the antenna 101) into a more useable analog voltage. According to an embodiment, the rectifier output voltage activates one or more indicators 104 that reflect the level of electromagnetic field exposure.

The indicators 104 may be any indicator known in the art that is able to indicate a property of an electromagnetic field based on an inputted analog voltage. According to an embodiment, indicators may be activated by the output voltage of one or more rectifiers. According to an embodiment, the indicators 104 may be visible, audible, and tactile indicators. Visible indicators may include, but are not limited to, light emitting diodes (e.g., where brightness indicates electromagnetic field strength). Audible indicators may include, but are not limited to, audible buzzers (e.g., where volume or tone indicate electromagnetic field strength). Tactile indicators may include, but are not limited to vibration buzzers (e.g., where vibration levels indicate electromagnetic field strength).

Figure 2:
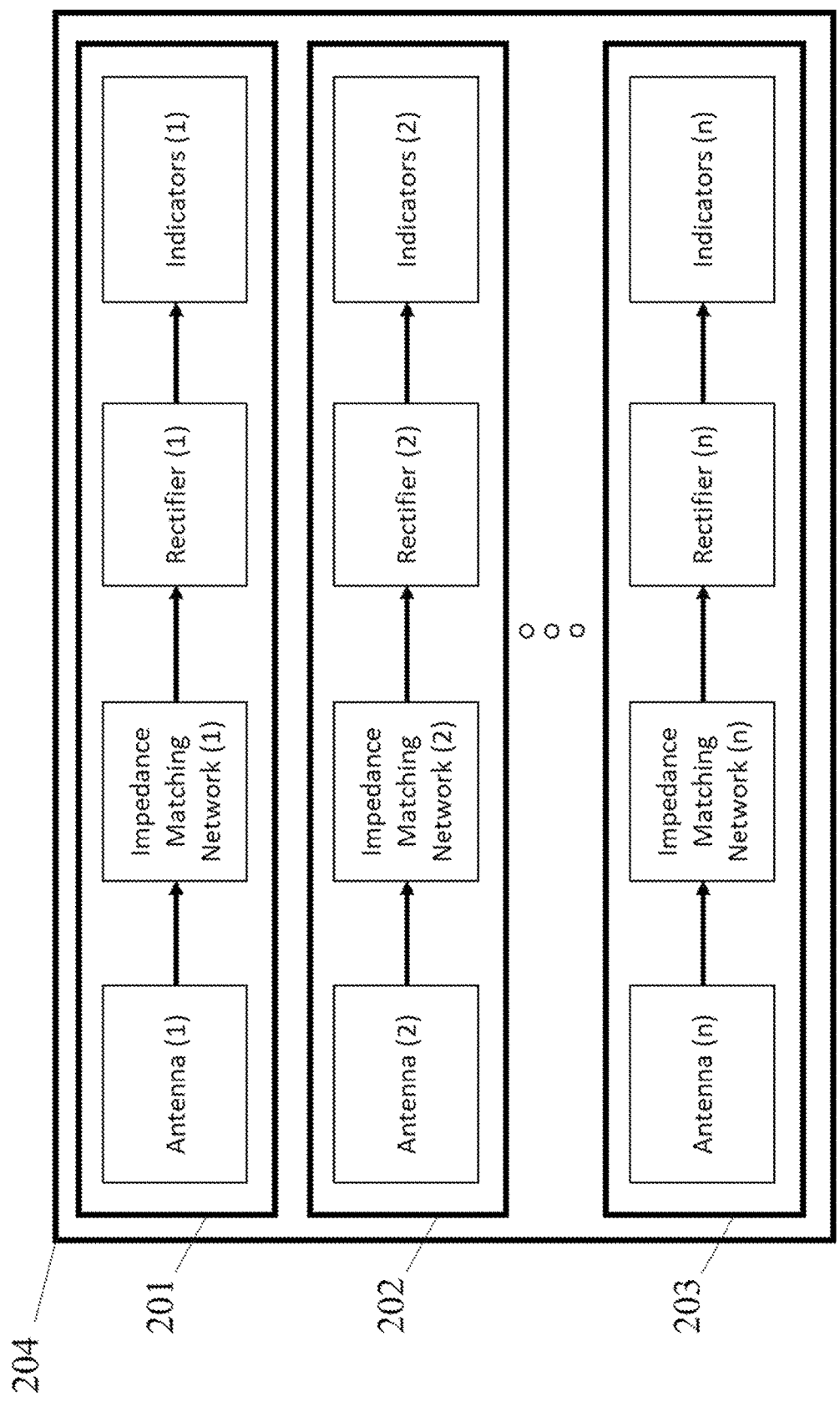
FIG. 2 is a block diagram illustrating example physical components of a multi-channel electromagnetic field monitoring device, according to an embodiment.

FIG. 2 is a block diagram illustrating example physical components of a multi-channel electromagnetic field monitoring device, according to an embodiment. The multi-channel electromagnetic field monitoring device may comprise multiple parallel channels, each channel comprising an antenna 101, an impedance matching network 102, a rectifier 103, and one or more indicators 104.

According to an embodiment, each channel may be configured to operate at a different frequency or frequency range to allow simultaneous monitoring of electromagnetic field levels at multiple frequencies of frequency ranges. Alternatively, two or more channels may be configured to operate at the same frequency or frequency range but may be calibrated to have different sensitivities. This can be done using antennas with different gains, tailoring the impedance matching networks to have different power transfer efficiencies, and using different rectifier topologies. Additionally, different types of indicators may be used for each channel.

Figure 3:
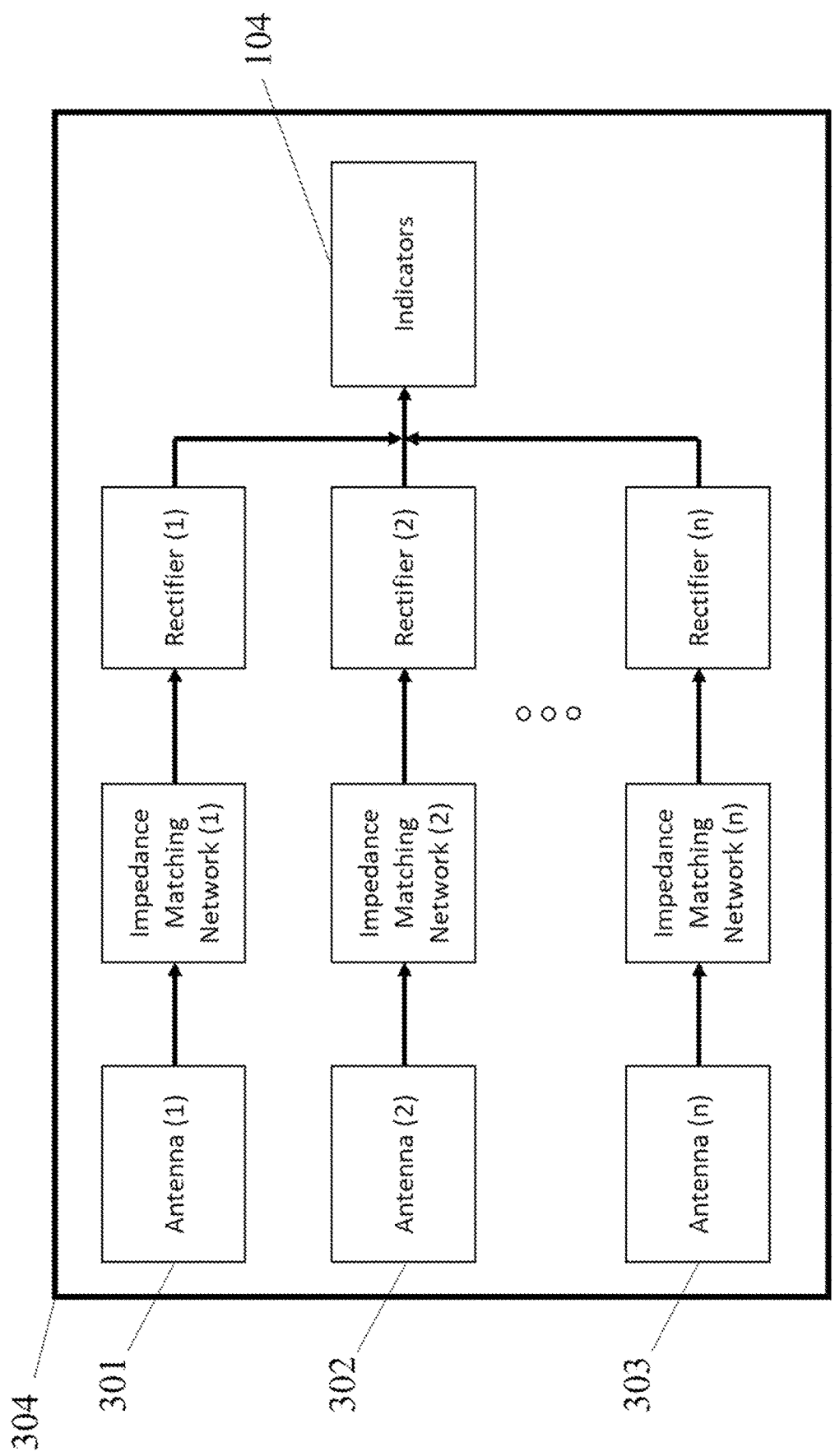
FIG. 3 is a block diagram illustrating example physical components of a multi-feed electromagnetic field monitoring device, according to an embodiment.

FIG. 3 is a block diagram illustrating example physical components of a multi-feed electromagnetic field monitoring device, according to an embodiment. The multi-feed electromagnetic field monitoring device may comprise multiple parallel channels 301 302 303, each channel comprising an antenna, an impedance matching network, and a rectifier. According to an embodiment, each channel may be configured to operate at a different frequency or frequency range. The device may further comprise one or more indicators 104. According to an embodiment, each of the indicators 104 is coupled with each of the rectifiers, enabling the channel with the largest rectifier output to drive the indicators 104. Alternatively, at least one of the indicators 104 is coupled with each of the rectifiers. Yet alternatively, each of the indicators 104 is coupled to a plurality of the rectifiers. Yet alternatively, at least one of the indicators 104 is coupled to a plurality of the rectifiers.

Figure 4:
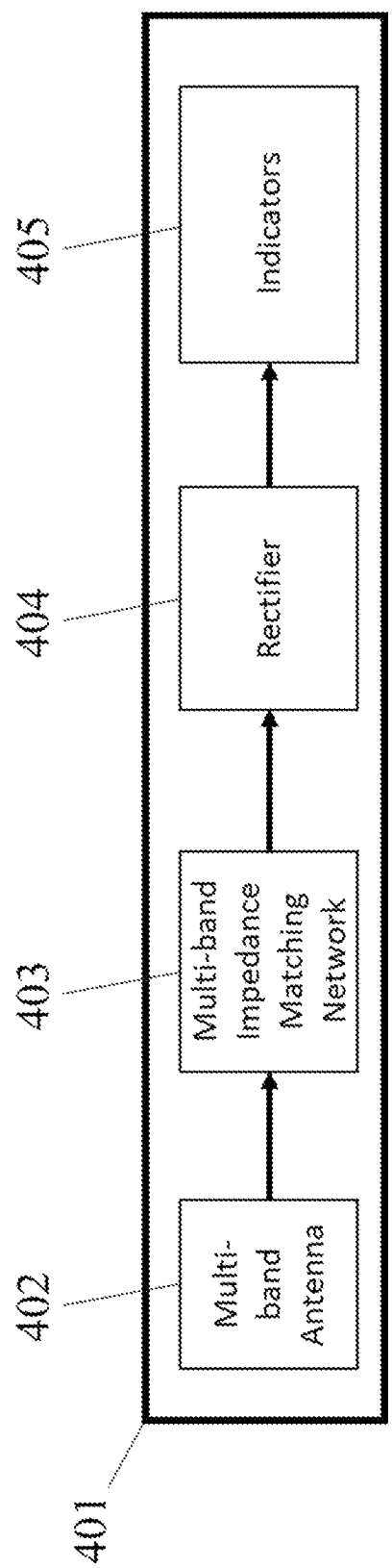
FIG. 4 is a block diagram illustrating example physical components of a multi-band electromagnetic field monitoring device, according to an embodiment.

FIG. 4 is a block diagram illustrating example physical components of a multi-band electromagnetic field monitoring device, according to an embodiment. The multi-band electromagnetic field monitoring device may comprise a multi-band antenna 402, a multi-band impedance matching network 403, a rectifier 404, and indicators 405.

The multiple-band antenna 402 is designed to efficiently receive ambient electromagnetic field energy at multiple frequencies. The multiple-band impedance matching network 403 provides impedance matching at those same frequencies to ensure maximum power transfer to the rectifier 404. This multiple-band embodiment has the potential for greater sensitivity due to its ability to collect and sum energy from multiple frequencies or multiple frequency ranges simultaneously.

Figure 5:
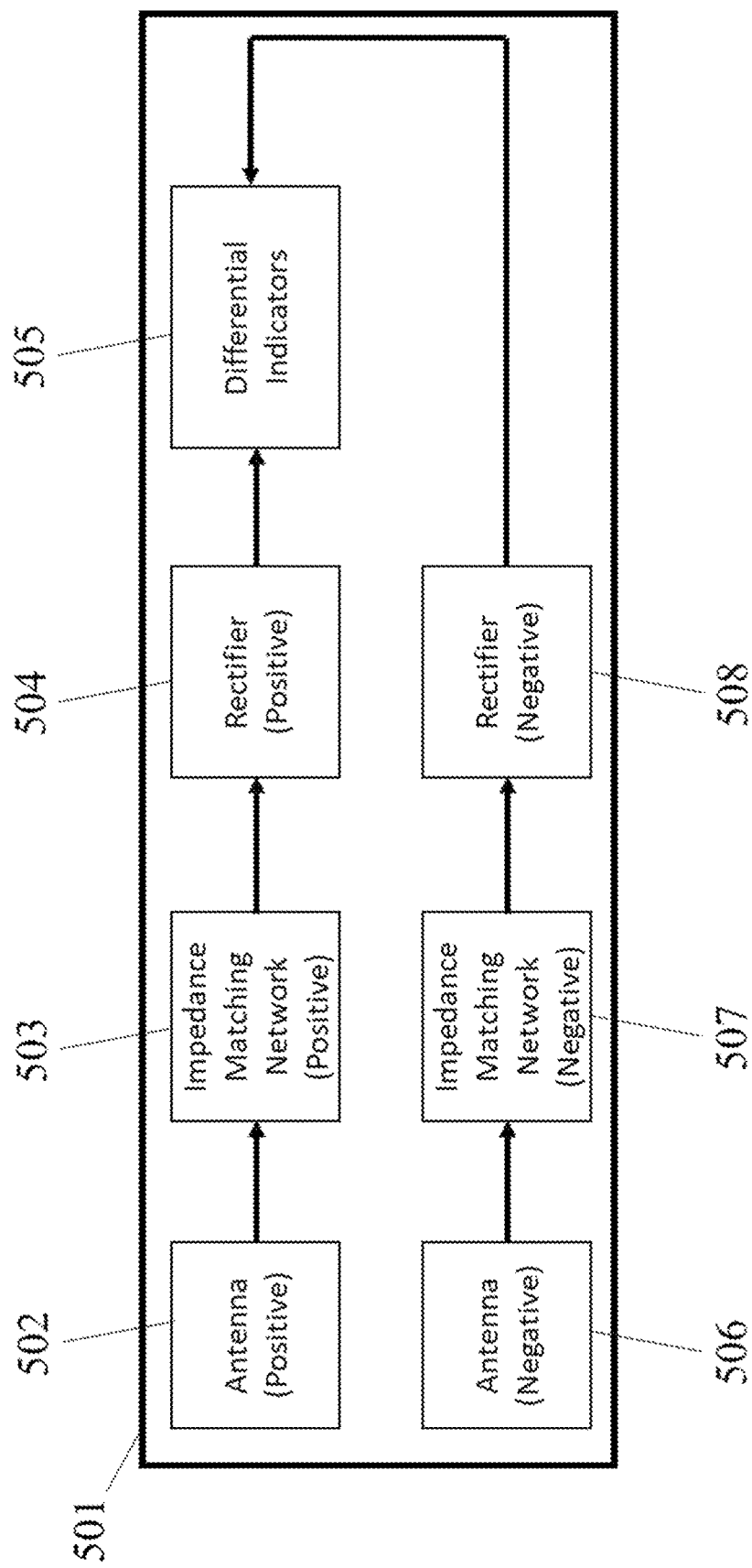
FIG. 5 is a block diagram illustrating example physical components of a differential electromagnetic field monitoring device, according to an embodiment.

FIG. 5 is a block diagram illustrating example physical components of a differential electromagnetic field monitoring device, according to an embodiment. The differential electromagnetic field monitoring device may comprise antennas 502 506, impedance matching networks 503 507, a positive rectifier 504, a negative rectifier 508, and differential indicators 505.

The positive rectifier 504 may output a positive driving signal to the differential indicators 505 while the negative rectifier 508 may output a negative driving signal to the differential indicators 505. Together, the two rectifiers 504 508 differentially drive the indicators 505, resulting in a greater driving voltage, and, thus, increased electromagnetic field monitoring sensitivity.

Figure 6:
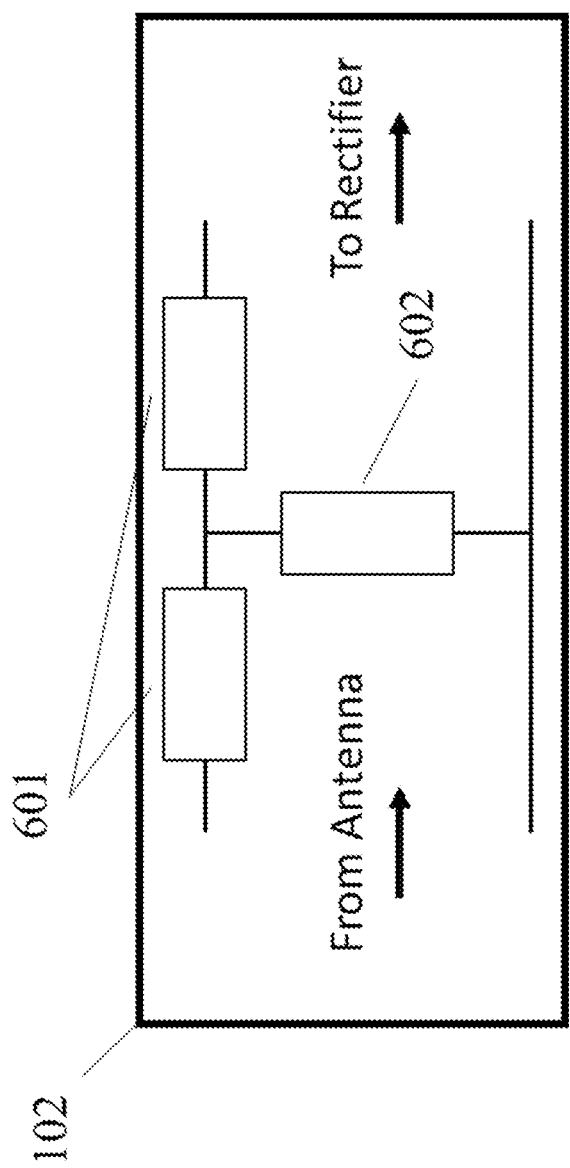
FIG. 6 is a schematic diagram illustrating an example "T" implementation of an impedance matching network, according to an embodiment.

FIG. 6 is a schematic diagram illustrating an example "T" implementation of an impedance matching network, according to an embodiment. The "T" implementation may comprise two series reactive elements 601 and a shunt reactive element 602, where each reactive element is one or more inductors or capacitors. In this configuration, one or more reactive elements may be excluded. Additionally, more complex impedance matching networks are possible. The impedance matching network 102 matches the impedance between the antenna 101 and rectifier 103. This ensures that maximum power is transferred between the two, resulting in greater measurement sensitivity. The impedance matching network 102 also filters out frequencies that are outside of the desired monitoring band, ensuring that the device responds most efficiently to frequencies of interest.

Figure 7:
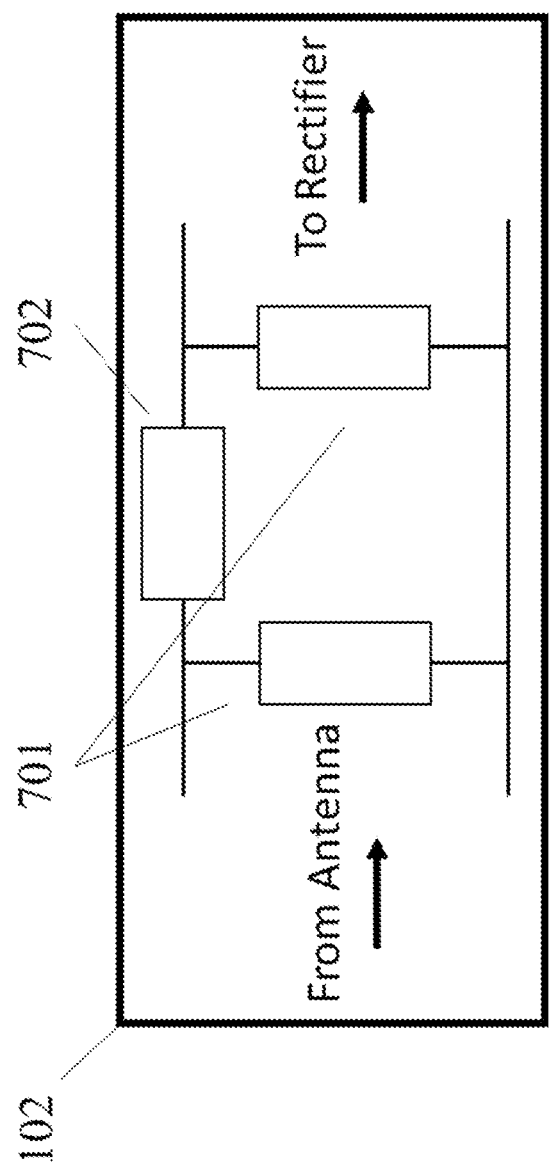
FIG. 7 is a schematic diagram illustrating an example "π" implementation of an impedance matching network, according to an embodiment.

FIG. 7 is a schematic diagram illustrating an example "π" implementation of an impedance matching network, according to an embodiment. The "π" implementation has two shunt reactive elements 701 and a series reactive element 702, where each reactive element is one or more inductors or capacitors. In this configuration, one or more reactive elements may be excluded. Additionally, more complex impedance matching networks are possible. The impedance matching network 102 matches the impedance between the antenna 101 and rectifier 103. This ensures that maximum power is transferred between the two, resulting in greater measurement sensitivity. The impedance matching network 102 also filters out frequencies that are outside of the desired monitoring band, ensuring that the device responds most efficiently to frequencies of interest.

Figure 8:
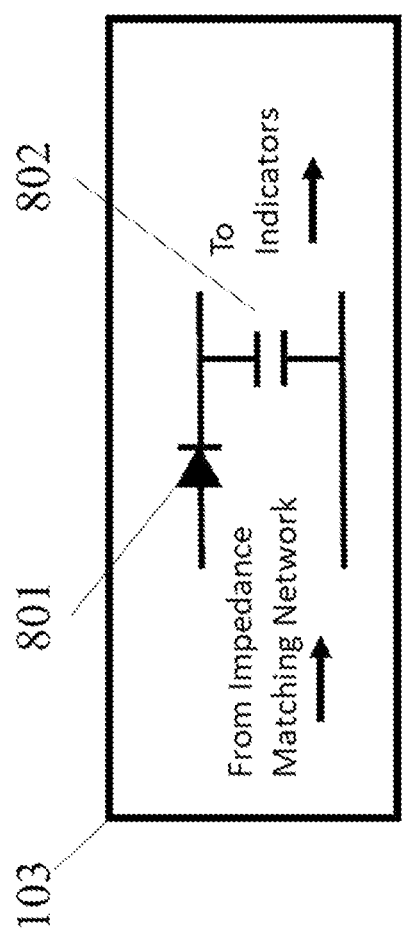
FIG. 8 is a schematic diagram illustrating an example single-diode rectifier topology, according to an embodiment.

FIG. 8 is a schematic diagram illustrating an example single-diode rectifier topology, according to an embodiment. The single series diode topology may comprise a diode 801 and capacitor 802. The diode 801 performs half wave rectification, and the capacitor 802 lowpass filters the resulting waveform to convert it into an analog voltage, which is then provided to the indicators 104.

Figure 9:
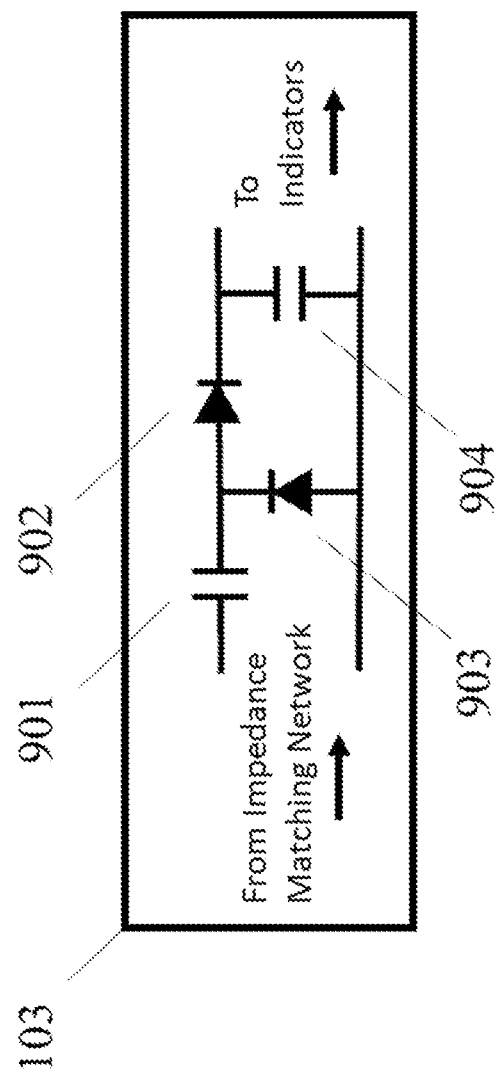
FIG. 9 is a schematic diagram illustrating an example half-wave voltage-boost rectifier topology, according to an embodiment.

FIG. 9 is a schematic diagram illustrating an example half-wave voltage-boost rectifier topology, according to an embodiment. The half-wave voltage-boost topology may comprise two capacitors 901 904 and two diodes 902 903. Together, the capacitor 901 and diodes 902 903 act as a charge pump circuit to boost and rectify the input signal. The rectified signal is converted to an analog voltage by capacitor 904 and provided to the indicators 104.

Figure 10:
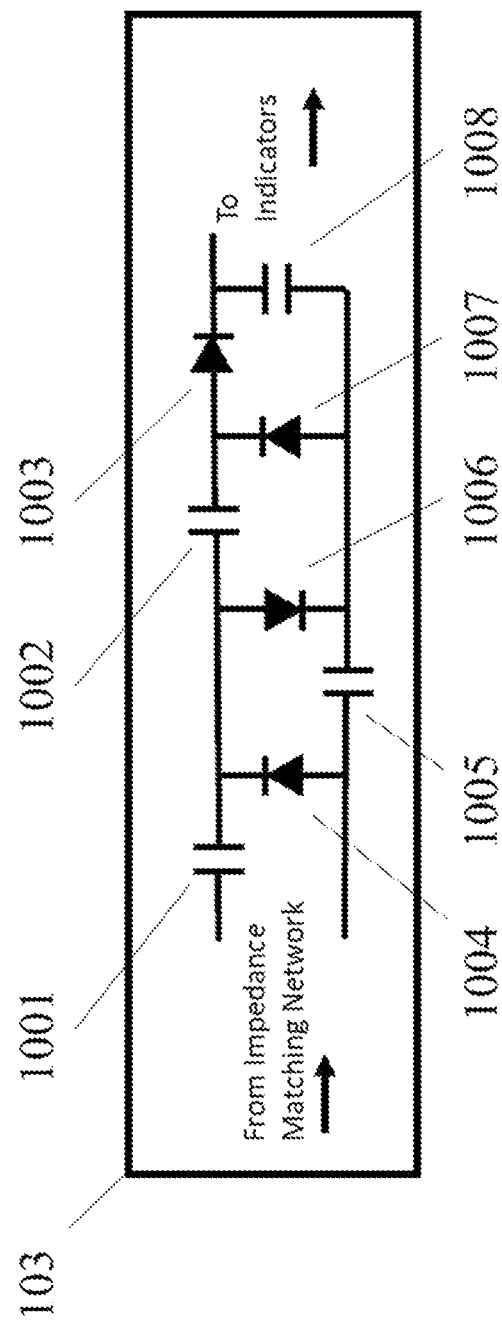
FIG. 10 is a schematic diagram illustrating an example two-stage voltage-boost rectifier topology, according to an embodiment.

FIG. 10 is a schematic diagram illustrating an example two-stage voltage-boost rectifier topology, according to an embodiment. The two-stage voltage-boost topology comprises four capacitors 1001 1002 1005 1008 and four diodes 1003 1004 1006 1007. The capacitors 1001 1002 1005 and diodes 1003 1004 1006 1007 act as a two-stage charge pump circuit to boost and rectify the input signal. The rectified voltage is converted to an analog voltage by capacitor 1008 and provided to the indicators 104.

Figure 11:
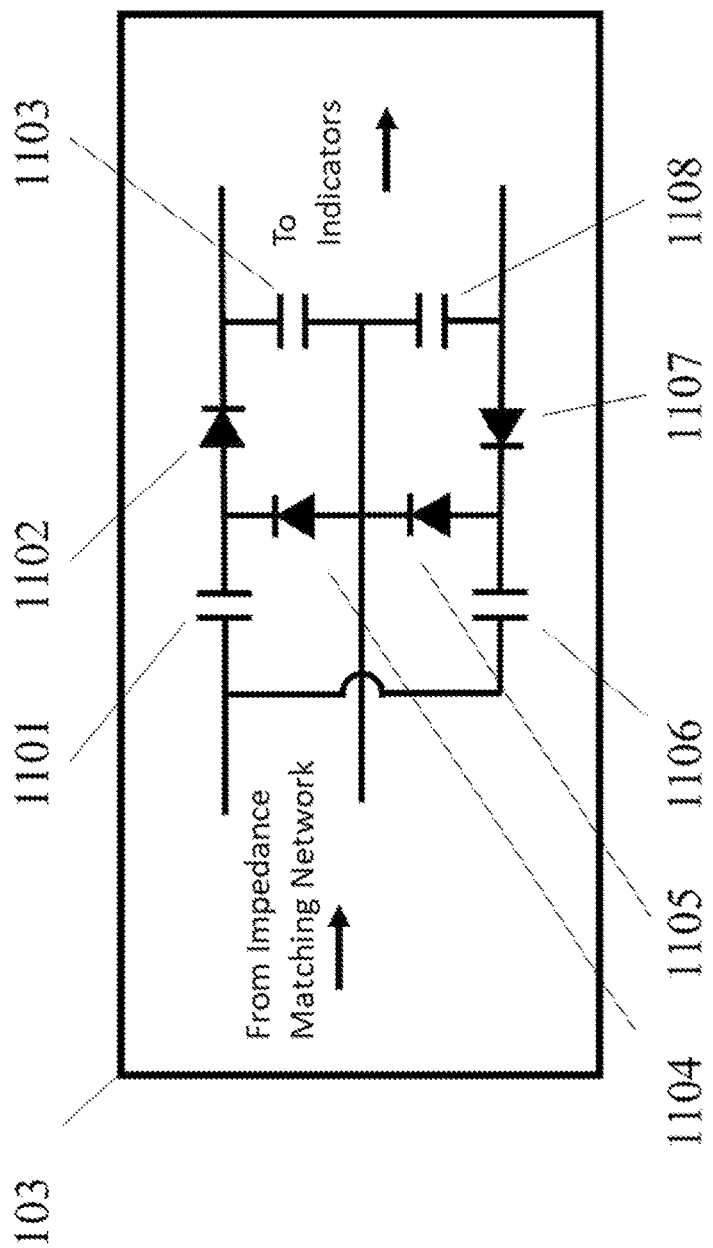
FIG. 11 is a schematic diagram illustrating an example full-wave voltage-boost rectifier topology, according to an embodiment.

FIG. 11 is a schematic diagram illustrating an example full-wave voltage-boost rectifier topology, according to an embodiment. The full-wave voltage-boost topology may comprise four capacitors 1101 1103 1106 1108 and four diodes 1102 1104 1105 1107. Capacitors 1101 1106 and diodes 1102 1104 1105 1107 act as a full-wave charge pump circuit to boost and rectify the input signal. The rectified voltage is converted to an analog voltage by capacitors 1103 1108 to provide a differential signal to the indicators 104.

Figure 12:
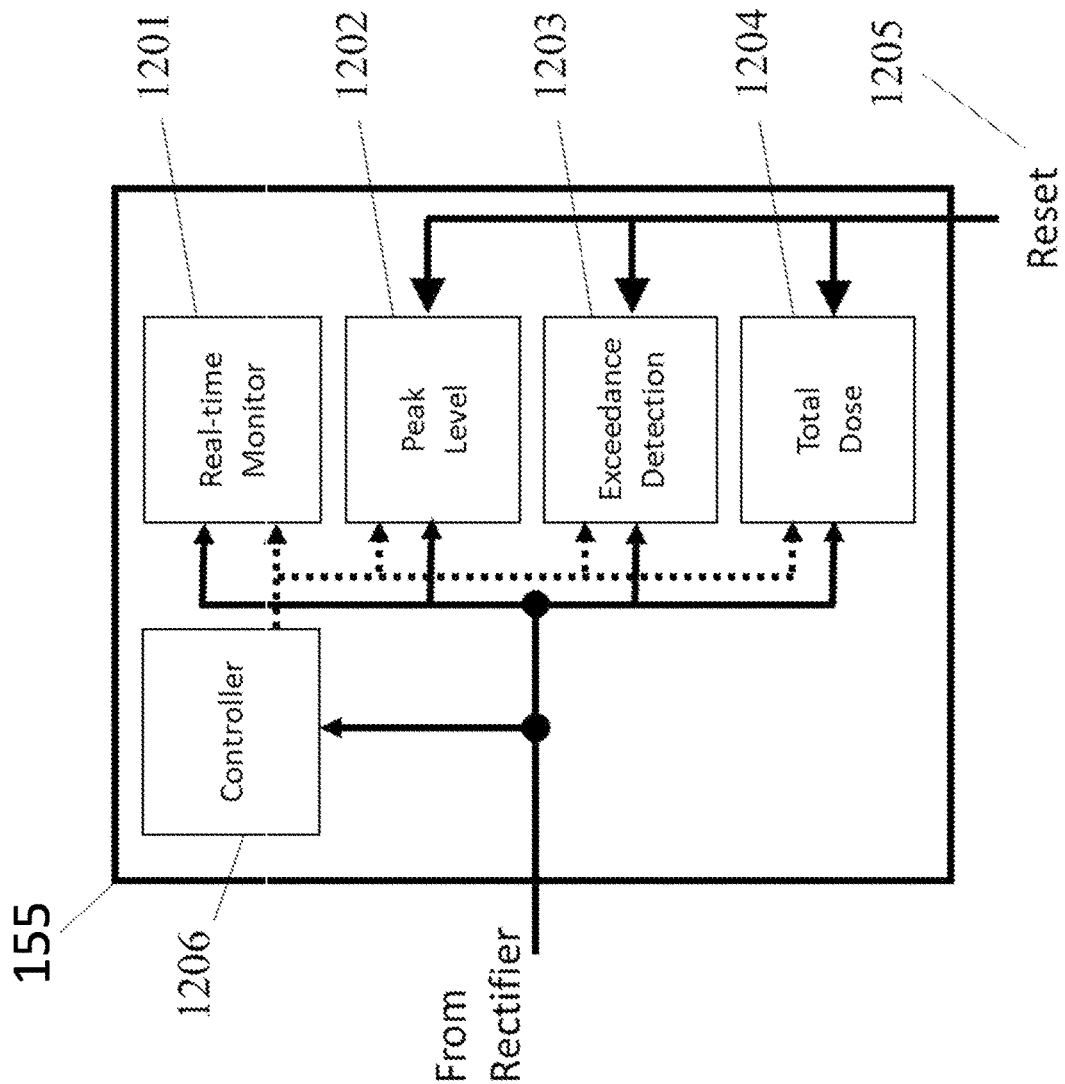
FIG. 12 is a block diagram illustrating example physical components of an indicator module, according to an embodiment.

FIG. 12 is a block diagram illustrating example physical components of an indicator module 155, according to an embodiment. The indicator module 155 may comprise a controller 1206 and a plurality of indicators. Indicators may include, but are not limited to, real-time electromagnetic field strength indicators 1201 (e.g., the indicator continuously indicates the current electromagnetic field strength), peak electromagnetic field strength indicators 1202 (e.g., the indicator indicates the highest electromagnetic field strength detected since the device was last reset), electromagnetic field exceedance indicators 1203 (e.g., the indicator will activate once a predetermined strength of electromagnetic field is detected), and cumulative electromagnetic field dose indicators 1204 (e.g., the indicator becomes increasingly active based on cumulative electromagnetic field dosage received and/or the indicator displays, in quantifiable terms, the cumulative electromagnetic field dosage received). In the case of peak strength, exceedance detection, and cumulative total dose monitoring, an external reset signal 1205 may be used to reset the indicators.

According to an embodiment, the indicator module 155 may further comprise a controller 1206. The controller 1206 may be configured to control the operation of indicators. The controller 1206 may be used in any embodiment of the electromagnetic field monitoring device where the complexity of the indicators or the complexity of the indicator arrangement requires additional control. The controller 1206 may be powered by the analog voltage output from at least one of the rectifiers.

According to an embodiment, the controller 1206 is comprised of a processor and memory.

The processor executes commands to perform the functions specified throughout this disclosure.

Memory may include various types of short and long-term memory as is known in the art. Memory may be loaded with various applications and/or instructions in the form of as computer readable program instructions that, when executed by the processor, control the operation of the indicators. These computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Figure 13:
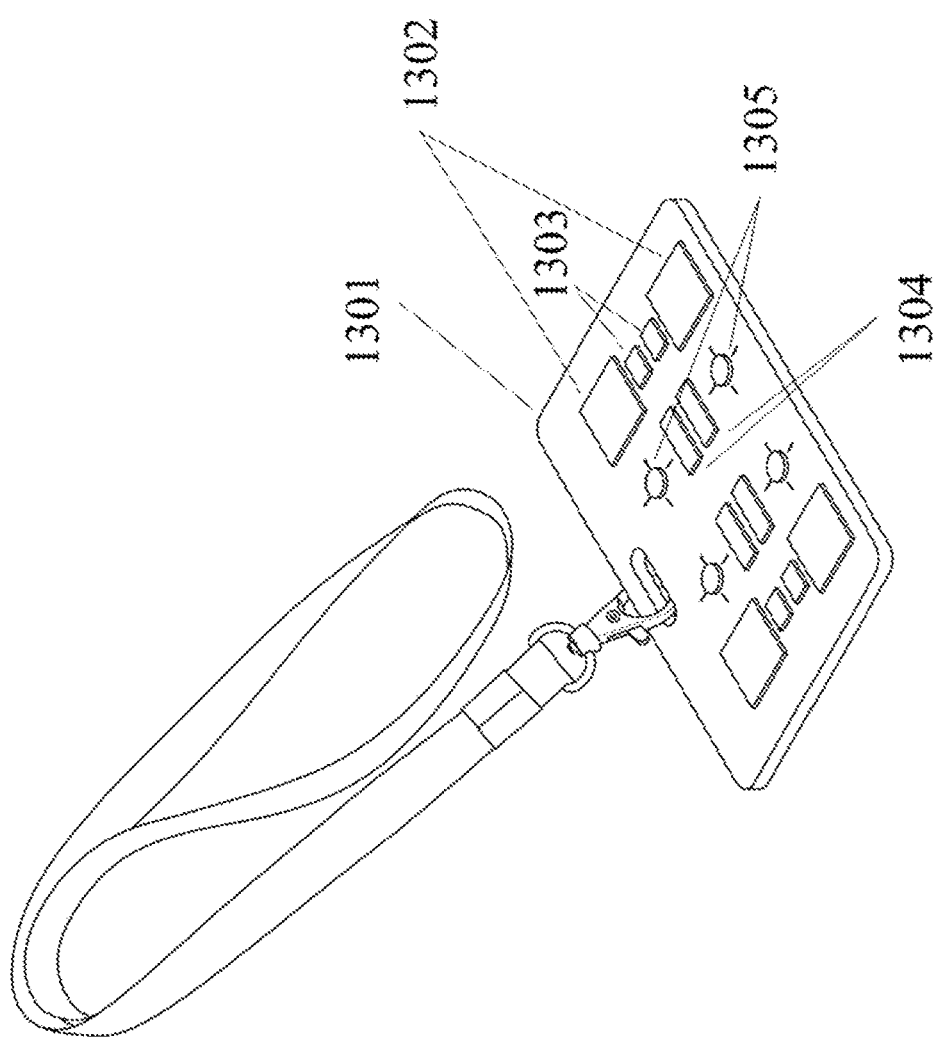
FIG. 13 illustrates an electromagnetic field monitoring device integrated into a lanyard identification card, according to an embodiment.

FIG. 13 illustrates an electromagnetic field monitoring device integrated into a lanyard identification card, according to an embodiment. The antennas 1302, impedance matching network 1303, rectifiers 1304, and indicators 1305 are constructed on a circuit board assembly which is either attached to, or integrated into, the lanyard card. In the illustrated embodiment, four electromagnetic monitoring channels are present, but any number are possible.

Figure 14:
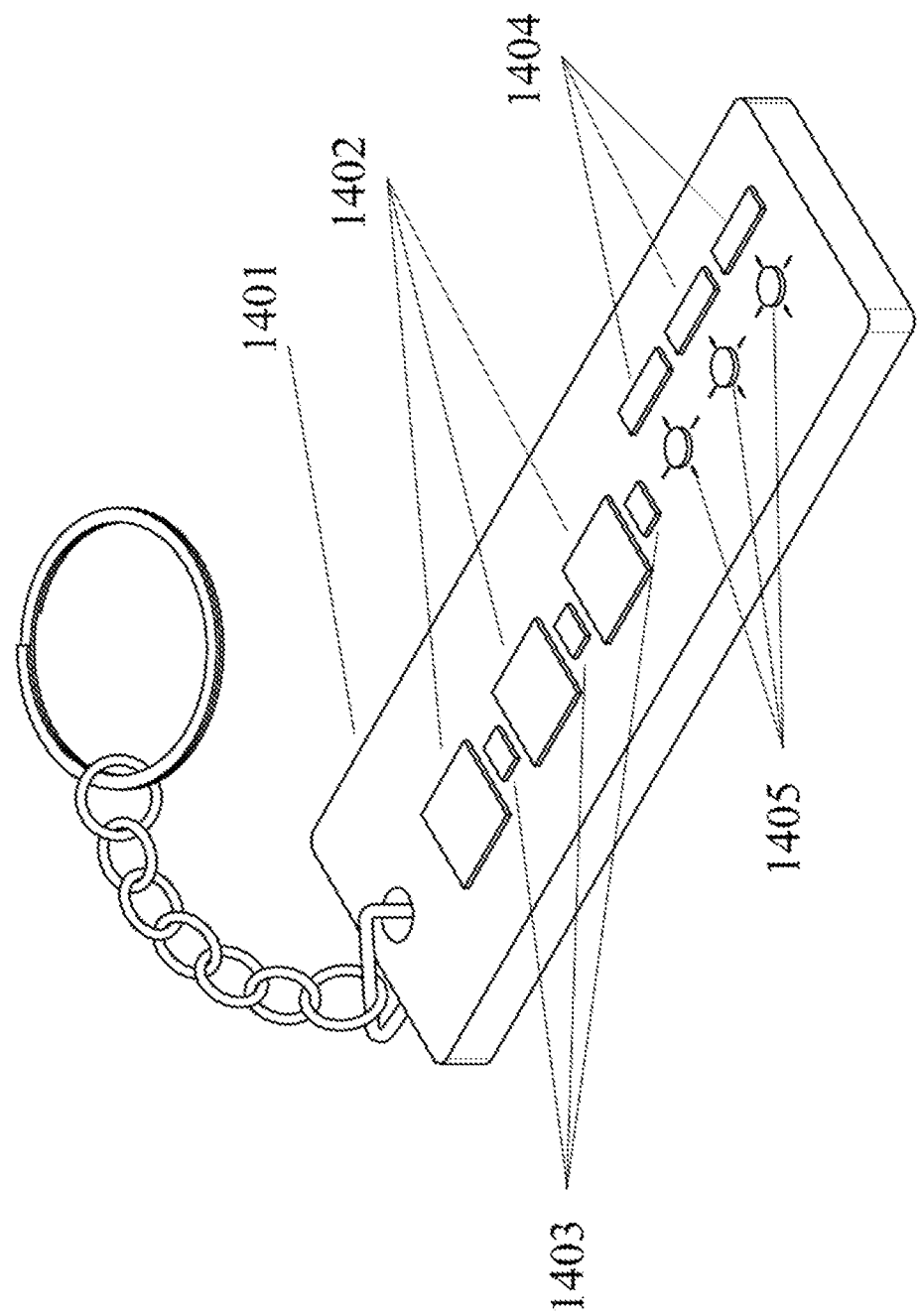
FIG. 14 illustrates an electromagnetic field monitoring device integrated into a keychain, according to an embodiment.

FIG. 14 illustrates an electromagnetic field monitoring device integrated into a keychain, according to an embodiment. The antennas 1402, impedance matching networks 1403, rectifiers 1404, and indicators 1405 are constructed on a circuit board assembly that is either attached to, or integrated into, the keychain attachment. In the illustrated embodiment, three electromagnetic monitoring channels are present, but any number are possible.

Figure 15:
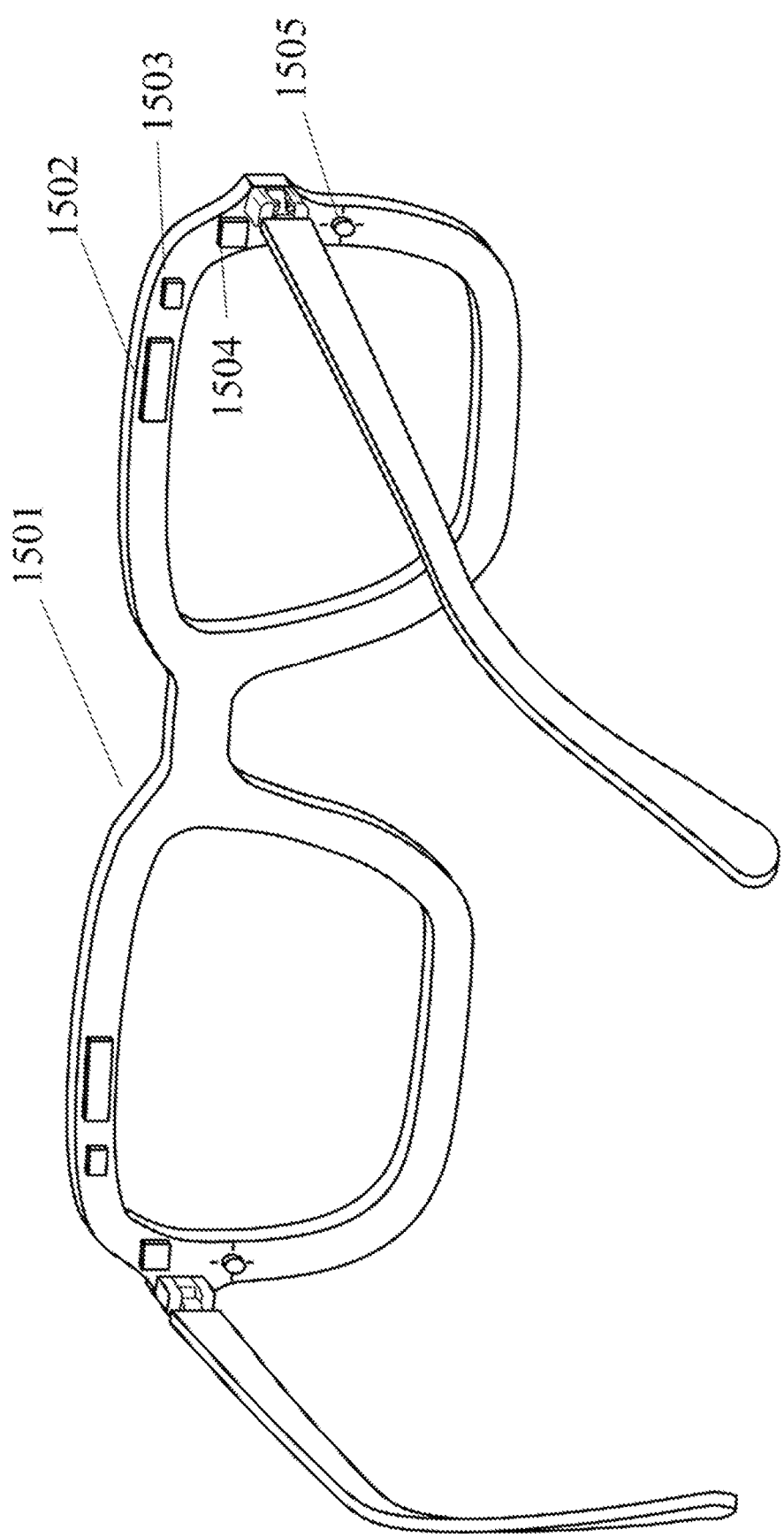
FIG. 15 illustrates an electromagnetic field monitoring device integrated into a frame of eyeglasses, according to an embodiment.

FIG. 15 illustrates an electromagnetic field monitoring device integrated into a frame of eyeglasses, according to an embodiment. The antennas 1502, impedance matching networks 1503, rectifiers 1504, and indicators 1505 are constructed on a circuit board assembly that is attached to, or integrated into, the eyeglasses frame. In the illustrated embodiment, two electromagnetic monitoring channels are present, but any number are possible.

Figure 16:
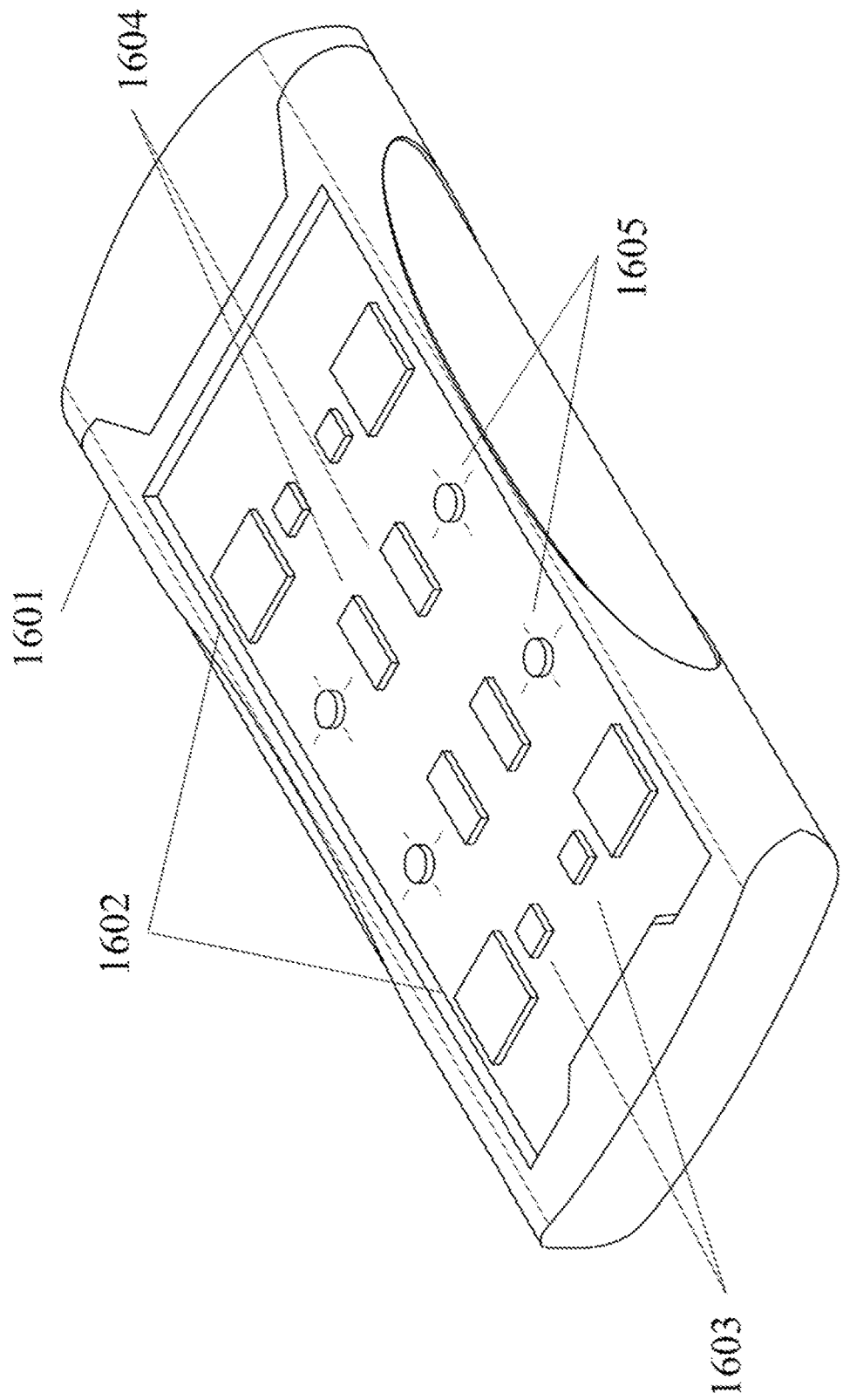
FIG. 16 illustrates an electromagnetic field monitoring device integrated into a handheld instrument, according to an embodiment.

FIG. 16 illustrates an electromagnetic field monitoring device integrated into a handheld instrument, according to an embodiment. The antennas 1602, impedance matching networks 1603, rectifiers 1604, and indicators 1605 are constructed on a circuit board assembly that is attached to, or integrated into, a handheld electronics housing. In the illustrated embodiment, four electromagnetic monitoring channels are present, but any number are possible.

Figure 17:
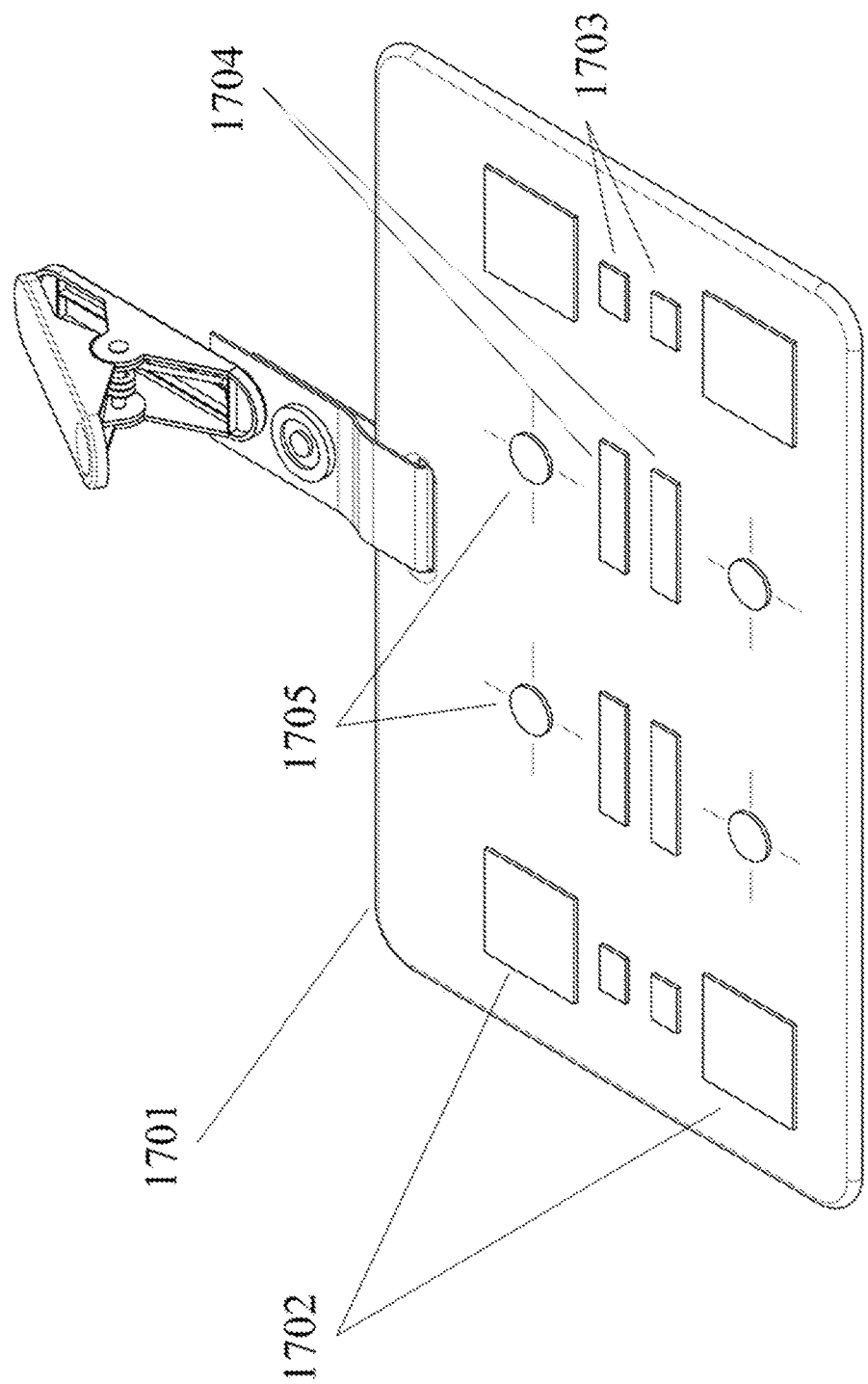
FIG. 17 illustrates an electromagnetic field monitoring device integrated into an identification card, according to an embodiment.

FIG. 17 illustrates an electromagnetic field monitoring device integrated into an identification card, according to an embodiment. The antennas 1702, impedance matching network 1703, rectifiers 1704, and indicators 1705 are constructed on a circuit board assembly which is either attached to, or integrated into, the identification card. In the illustrated embodiment, four electromagnetic monitoring channels are present, but any number are possible.

Figure 18:
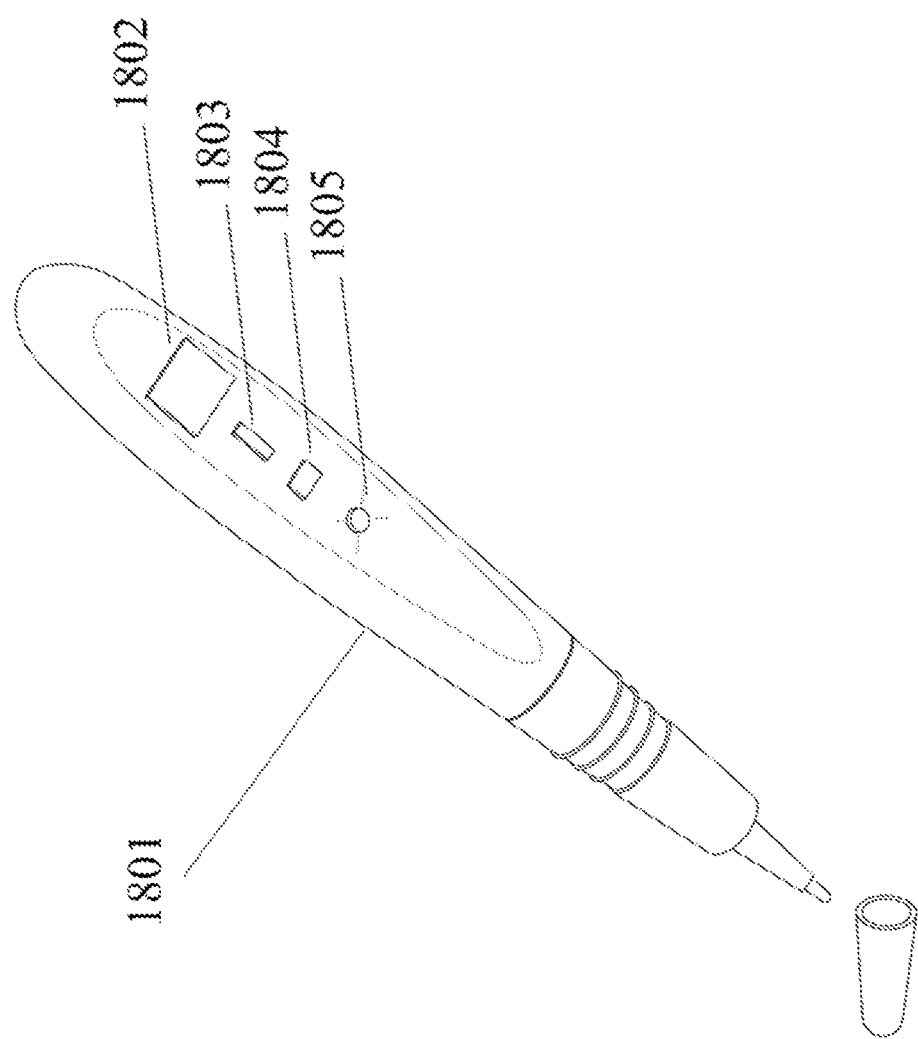
FIG. 18 illustrates an electromagnetic field monitoring device integrated into a writing instrument, according to an embodiment.

FIG. 18 illustrates an electromagnetic field monitoring device integrated into a writing instrument, according to an embodiment. The antennas 1802, impedance matching network 1803, rectifiers 1804, and indicators 1805 are constructed on a circuit board assembly which is either attached to, or integrated into, the writing instrument. In the illustrated embodiment, one electromagnetic monitoring channel is present, but any number are possible.

Figure 19:
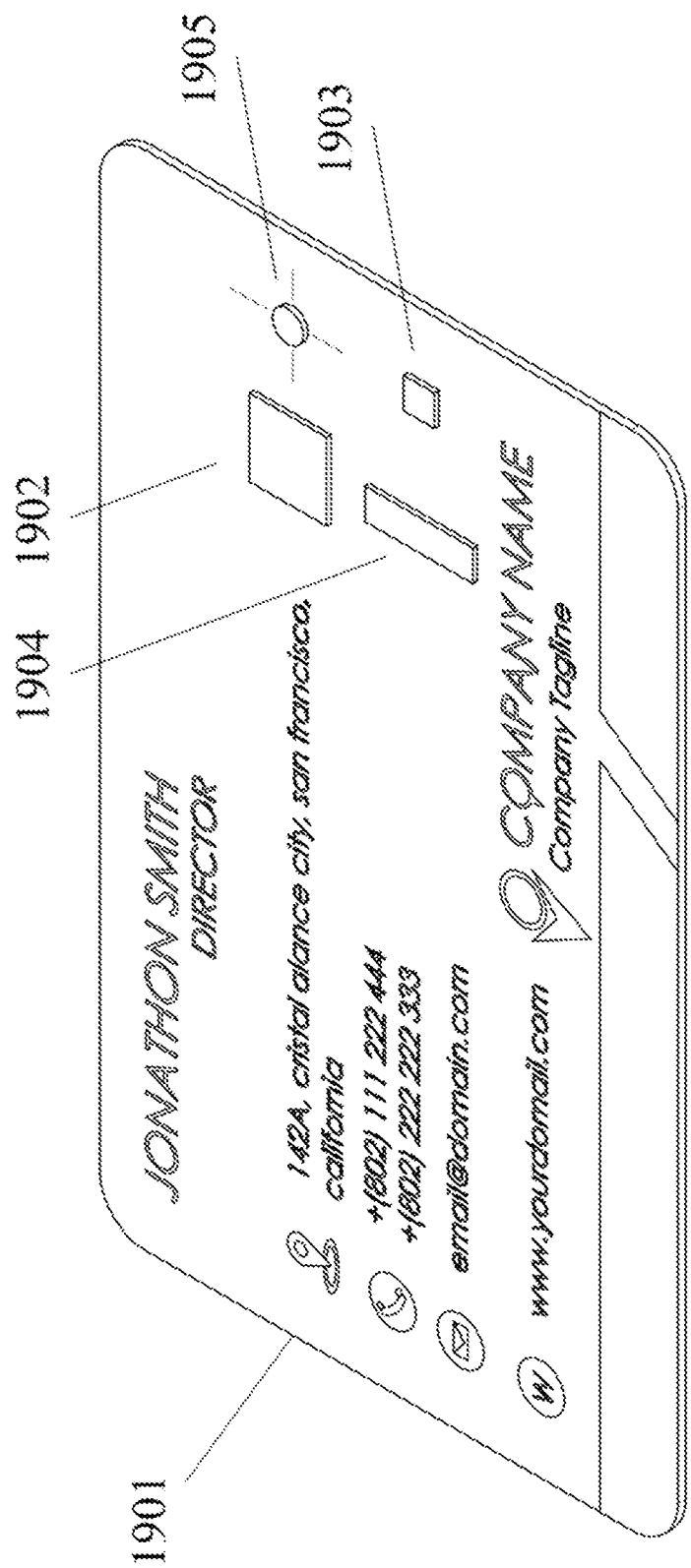
FIG. 19 illustrates an electromagnetic field monitoring device integrated into a business card, according to an embodiment.

FIG. 19 illustrates an electromagnetic field monitoring device integrated into a business card, according to an embodiment. The antennas 1902, impedance matching network 1903, rectifiers 1904, and indicators 1905 are constructed on a circuit board assembly which is either attached to, or integrated into, the business card. In the illustrated embodiment, one electromagnetic monitoring channel is present, but any number are possible.

Figure 20:
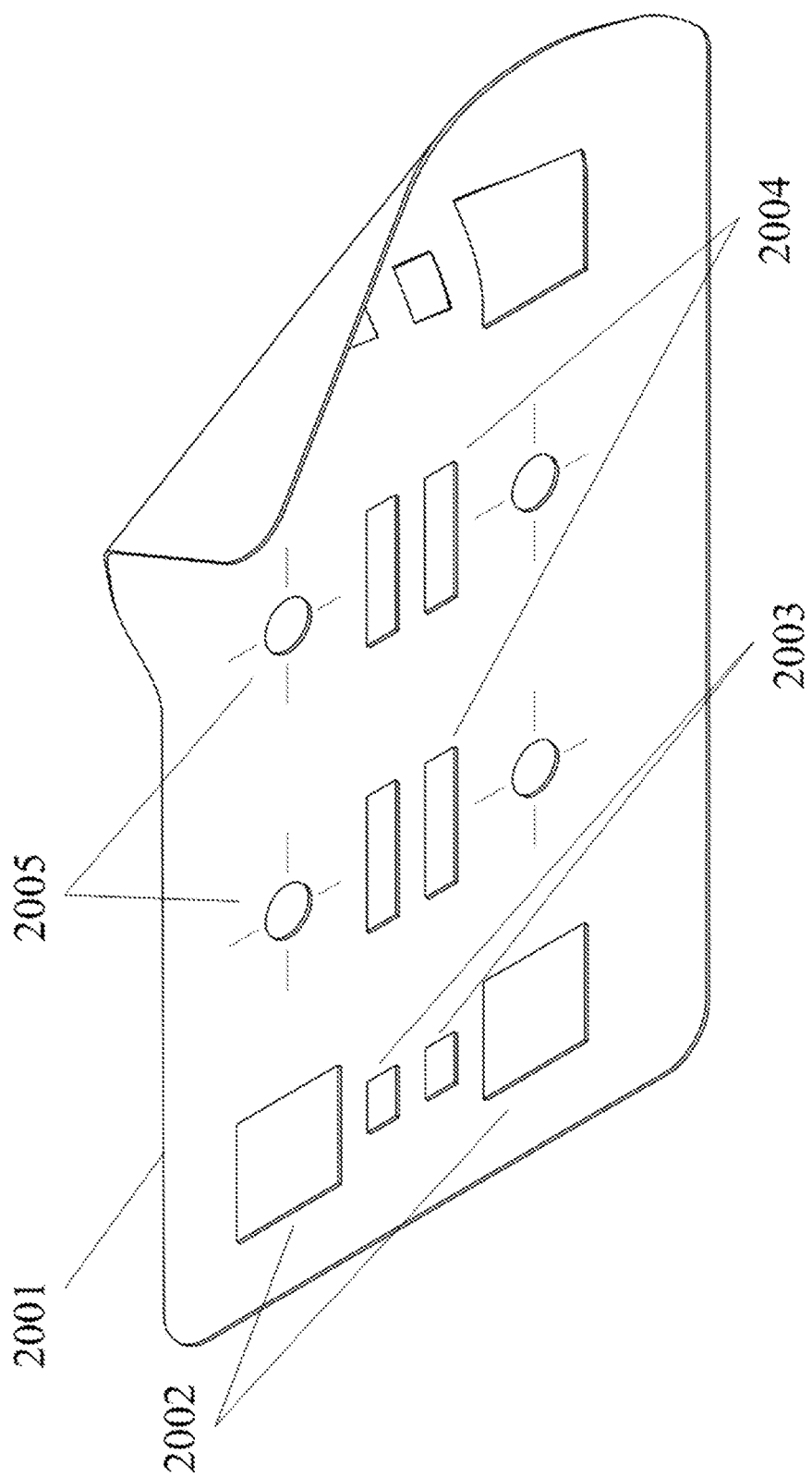
FIG. 20 illustrates an electromagnetic field monitoring device integrated into an adhesive sticker, according to an embodiment.

FIG. 20 illustrates an electromagnetic field monitoring device integrated into an adhesive sticker, according to an embodiment. The antennas 2002, impedance matching network 2003, rectifiers 2004, and indicators 2005 are constructed on a circuit board assembly which is either attached to, or integrated into, the adhesive sticker. In the illustrated embodiment, four electromagnetic monitoring channels are present, but any number are possible.

Figure 21:
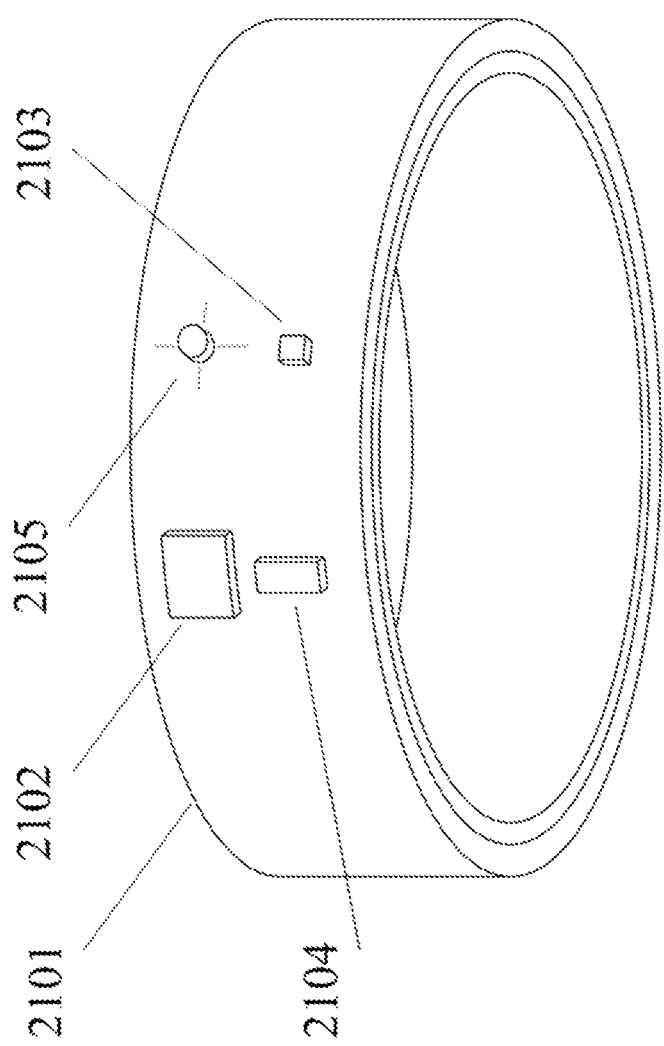
FIG. 21 illustrates an electromagnetic field monitoring device integrated into a ring, according to an embodiment.

FIG. 21 illustrates an electromagnetic field monitoring device integrated into a ring, according to an embodiment. The antennas 2102, impedance matching network 2103, rectifiers 2104, and indicators 2105 are constructed on a circuit board assembly which is either attached to, or integrated into, the ring. In the illustrated embodiment, one electromagnetic monitoring channels is present, but any number are possible.

Figure 22:
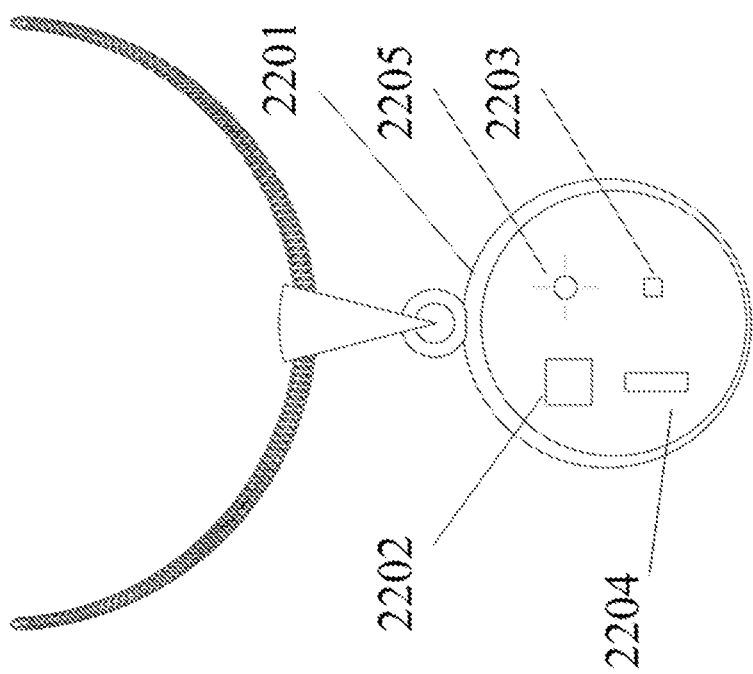
FIG. 22 illustrates an electromagnetic field monitoring device integrated into a necklace pendant, according to an embodiment.

FIG. 22 illustrates an electromagnetic field monitoring device integrated into a necklace pendant, according to an embodiment. The antennas 2202, impedance matching network 2203, rectifiers 2204, and indicators 2205 are constructed on circuit board assembly which is either attached to, or integrated into, the necklace pendant. In the illustrated embodiment, one electromagnetic monitoring channel is present, but any number are possible.

The electromagnetic field monitoring devices of this disclosure embody a significant advance over existing electromagnetic field monitoring devices that lack the ease-of-use and adaptability of the present invention.

The present invention does not require user activation. Rather, the device is autonomous, automatically turning on when in the presence of an electromagnetic field and automatically turning off once a user is removed from the electromagnetic field.

The present invention does not rely on batteries or outside power sources. Rather, the device is powered solely by ambient electromagnetic energy received from an electromagnetic field, allowing the present invention to be miniaturized and integrated into a variety of products, including, but not limited to, a keychain attachment, lanyard attachment, eyeglasses frame, handheld instrument, identification card, writing instrument, business card, adhesive sticker, ring, or necklace pendant.

I claim:
1. An electromagnetic field monitoring device configured to:
 an antenna configured to receive ambient electromagnetic energy from an electromagnetic field;
 an impedance matching network coupled to the antenna;
 a rectifier coupled to the impedance matching network and configured to output an analog voltage based on the ambient electromagnetic energy received by the antenna; and
 an indicator coupled to the rectifier and configured to indicate a property of the electromagnetic field;
 wherein the device is powered by the ambient electromagnetic energy received from the electromagnetic field.
2. The device of claim 1, wherein the indicator is one of a visible indicator, an audible indicator, and a tactile indicator.
3. The device of claim 1, wherein the property is at least one of real-time electromagnetic field strength, peak electromagnetic field strength in a time period, electromagnetic field exceedance, and cumulative electromagnetic field dose.
4. The device of claim 1, wherein the device is comprised of:
 a plurality of the antenna configured to receive the ambient electromagnetic energy of the electromagnetic field;
 a plurality of the impedance matching network each coupled to a respective one of the plurality of the antenna;
 a plurality of the rectifier each coupled to a respective impedance matching network and configured to output an analog voltage based on the ambient electromagnetic energy received by the respective antenna; and
 an indicator coupled to one or more of the plurality of the rectifier and configured to indicate the property of the electromagnetic field.
5. The device of claim 4, wherein the property is at least one of real-time electromagnetic field strength, peak electromagnetic field strength in a time period, electromagnetic field exceedance, and cumulative electromagnetic field dose.
6. The device of claim 4, wherein at least one of the indicators is further coupled to all of the rectifiers.
7. The device of claim 4, wherein each of the antennas is configured to receive a same frequency range of the ambient electromagnetic energy.
8. The device of claim 4, wherein at least one of the antennas is configured to receive a different frequency range of the ambient electromagnetic energy.
9. The device of claim 4, wherein each impedance matching network is configured to attenuate frequencies that are out of a desired detection band.
10. The device of claim 1, wherein each of the impedance matching networks are configured to attenuate frequencies that are out of a desired detection band.
11. The device of claim 1, wherein the device is comprised of:

a first plurality of antennas configured to receive the ambient electromagnetic energy of the electromagnetic field;

a second plurality of impedance matching networks, each of the impedance matching networks coupled to at least one of the antennas;

a third plurality of rectifiers, each of the rectifiers coupled to at least one of the impedance matching networks and configured to output an analog voltage based on the ambient electromagnetic energy received by at least one of the antennas; and wherein the indicator is coupled to at least one of the rectifiers and configured to indicate the property of the electromagnetic field.

12. The device of claim 11, wherein the property is at least one of real-time electromagnetic field strength, peak electromagnetic field strength in a time period, electromagnetic field exceedance, and cumulative electromagnetic field dose.

13. The device of claim 11, wherein at least one of the indicators is further coupled to of all the rectifiers.

14. The device of claim 11, wherein each of the antennas is configured to receive a same frequency range of the ambient electromagnetic energy.

15. The device of claim 11, wherein at least one of the antennas is configured to receive a different frequency range of the ambient electromagnetic energy.

16. The device of claim 11, wherein at least one of the indicators is coupled differentially to at least two of the rectifiers.

17. The device of claim 4, wherein each impedance matching network is configured to have different power transfer efficiencies.

18. The device of claim 11, wherein each of the impedance matching networks is configured to have different power transfer efficiencies.

19. The device of claim 1, wherein the impedance matching network is configured to attenuate frequencies that are out of a desired detection band.

\* \* \* \* \*